United States Patent
Venkata et al.

(10) Patent No.: US 9,438,272 B1
(45) Date of Patent: *Sep. 6, 2016

(54) DIGITAL PHASE LOCKED LOOP CIRCUITRY AND METHODS

(71) Applicant: Altera Corporation, San Jose, CA (US)

(72) Inventors: Ramanand Venkata, San Jose, CA (US); Chong H. Lee, San Ramon, CA (US)

(73) Assignee: Altera Corporation, San Jose, CA (US)

( * ) Notice: Subject to any disclaimer, the term of this patent is extended or adjusted under 35 U.S.C. 154(b) by 20 days.

This patent is subject to a terminal disclaimer.

(21) Appl. No.: 14/331,933

(22) Filed: Jul. 15, 2014

Related U.S. Application Data

(63) Continuation of application No. 13/907,158, filed on May 31, 2013, now Pat. No. 8,804,890, which is a continuation of application No. 12/974,949, filed on Dec. 21, 2010, now Pat. No. 8,462,908, which is a continuation of application No. 10/923,129, filed on Aug. 20, 2004, now Pat. No. 7,869,553, which is a continuation-in-part of application No. 10/349,541, filed on Jan. 21, 2003, now Pat. No. 7,138,837.

(51) Int. Cl.
  *H04L 7/00* (2006.01)
  *H03M 9/00* (2006.01)

(52) U.S. Cl.
  CPC ............. *H03M 9/00* (2013.01); *H04L 7/0008* (2013.01)

(58) Field of Classification Search
  CPC .. G06F 3/0611; G06F 3/0644; G06F 3/0664; G06F 12/0875; G06F 3/0685; G06F 9/3877; G06F 15/785; G06F 9/30047; H04L 47/10; H04L 47/22; H04L 7/0008; H04L 7/027; H04L 27/1566; H03L 7/08
  USPC ................ 375/355, 354, 376, 371, 373, 375
  See application file for complete search history.

(56) References Cited

U.S. PATENT DOCUMENTS

| | | | |
|---|---|---|---|
| 5,012,240 A | * | 4/1991 | Takahashi ............... H03M 9/00 341/101 |
| 5,355,090 A | | 10/1994 | Pajowski et al. |
| 5,387,911 A | * | 2/1995 | Gleichert et al. ............... 341/95 |
| 5,668,830 A | | 9/1997 | Georgiou et al. |
| 5,714,904 A | | 2/1998 | Jeong |
| 6,100,735 A | | 8/2000 | Lu |
| 6,125,157 A | | 9/2000 | Donnelly et al. |
| 6,266,799 B1 | | 7/2001 | Lee et al. |
| 6,282,204 B1 | | 8/2001 | Balatoni et al. |
| 6,292,116 B1 | | 9/2001 | Wang et al. |

(Continued)

FOREIGN PATENT DOCUMENTS

EP  1 113 616  7/2001

*Primary Examiner* — Helene Tayong
(74) *Attorney, Agent, or Firm* — Fletcher Yoder, P.C.

(57) ABSTRACT

Phase locked loop circuitry operates digitally, to at least a large extent, to select from a plurality of phase-distributed candidate clock signals the signal that is closest in phase to transitions in another signal such as a clock data recovery ("CDR") signal. The circuitry is constructed and operated to avoid glitches in the output clock signal that might otherwise result from changes in selection of the candidate clock signal. Frequency division of the candidate clock signals may be used to help the circuitry support serial communication at bit rates below frequencies that an analog portion of the phase locked loop circuitry can economically provide. Over-transmission or over-sampling may be used on the transmit side for similar reasons.

20 Claims, 14 Drawing Sheets

(56) References Cited

U.S. PATENT DOCUMENTS

| | | | |
|---|---|---|---|
| 6,326,813 B2 | 12/2001 | Lindsay | |
| 6,377,575 B1 * | 4/2002 | Mullaney et al. | 370/360 |
| 6,452,591 B1 | 9/2002 | Ho et al. | |
| 6,646,480 B2 | 11/2003 | Weng et al. | |
| 6,650,140 B2 | 11/2003 | Lee et al. | |
| 6,693,985 B2 | 2/2004 | Li et al. | |
| 6,750,675 B2 | 6/2004 | Venkata et al. | |
| 6,854,044 B1 | 2/2005 | Venkata et al. | |
| 6,900,676 B1 | 5/2005 | Tamura | |
| 6,934,301 B2 | 8/2005 | Jordan | |
| 6,996,650 B2 | 2/2006 | Calvignac et al. | |
| 7,015,838 B1 * | 3/2006 | Groen | H03M 9/00 341/100 |
| 7,016,452 B2 | 3/2006 | Partsch et al. | |
| 7,088,767 B1 * | 8/2006 | Cory | 375/219 |
| 7,089,444 B1 | 8/2006 | Asaduzzaman et al. | |
| 7,091,890 B1 | 8/2006 | Sasaki et al. | |
| 7,116,251 B1 * | 10/2006 | Groen | H03M 9/00 341/100 |
| 7,142,621 B2 | 11/2006 | Vallet et al. | |
| 7,151,470 B1 * | 12/2006 | Xue | H03M 7/04 341/61 |
| 7,180,972 B1 * | 2/2007 | Venkata et al. | 375/371 |
| 7,190,754 B1 | 3/2007 | Chang et al. | |
| 7,227,918 B2 | 6/2007 | Aung et al. | |
| 7,242,221 B1 | 7/2007 | Hoang et al. | |
| 7,305,058 B1 | 12/2007 | Venkata et al. | |
| 7,315,596 B2 | 1/2008 | Payne et al. | |
| 7,336,666 B1 * | 2/2008 | Grivna | 370/395.51 |
| 7,366,267 B1 | 4/2008 | Lee et al. | |
| 7,397,788 B2 | 7/2008 | Mies et al. | |
| 7,471,752 B2 | 12/2008 | Ge et al. | |
| 7,543,209 B2 | 6/2009 | Bonneau et al. | |
| 8,949,448 B1 * | 2/2015 | Saxtorph | H04L 69/28 341/61 |
| 2001/0033188 A1 | 10/2001 | Aung et al. | |
| 2002/0190751 A1 | 12/2002 | Lee et al. | |
| 2003/0006808 A1 | 1/2003 | Weng et al. | |
| 2003/0012322 A1 | 1/2003 | Partsch et al. | |
| 2003/0048209 A1 | 3/2003 | Buchanan et al. | |
| 2003/0052709 A1 | 3/2003 | Venkata et al. | |
| 2003/0086517 A1 | 5/2003 | Vallet et al. | |
| 2003/0217214 A1 | 11/2003 | Calvignac et al. | |
| 2004/0028164 A1 * | 2/2004 | Jiang et al. | 375/371 |
| 2004/0030805 A1 * | 2/2004 | Fujimori et al. | 709/250 |
| 2004/0066870 A1 | 4/2004 | Gabara et al. | |
| 2004/0085974 A1 | 5/2004 | Mies et al. | |
| 2004/0098430 A1 * | 5/2004 | Linkewitsch | G06F 1/025 708/270 |
| 2005/0180536 A1 | 8/2005 | Payne et al. | |
| 2006/0029176 A1 | 2/2006 | Ge et al. | |
| 2006/0095605 A1 | 5/2006 | Lee et al. | |
| 2006/0227917 A1 | 10/2006 | Buchwald et al. | |
| 2010/0246658 A1 | 9/2010 | Fujimori et al. | |

* cited by examiner

| MODE OF OPERATION (SERIAL BITS PER SECOND) | ANALOG CDR (A-CDR) PHASE DETECTOR | | DPLL 8-PHASE CLOCK | | JITTER |
|---|---|---|---|---|---|
| | SERIAL CLOCK/DATA RATE RATIO | SERIAL CLOCK FREQ. (GHz) | DIVIDE SERIAL CLOCK FROM A-CDR BY | FREQUENCY (GHz) | |
| NORMAL 0.25G TO 1.0G | 2 | 0.5 TO 2.0 | 1 | 0.5 TO 2.0 | 45° |
| LOW 0.1G TO 0.25G | 8 | 0.8 TO 2.0 | 4 | 0.2 TO 0.5 | |

FIG. 7

| MODE OF OPERATION (SERIAL BITS PER SECOND) | ANALOG CDR (A-CDR) PHASE DETECTOR | | DPLL 16-PHASE CLOCK | | JITTER |
|---|---|---|---|---|---|
| | SERIAL CLOCK/DATA RATE RATIO | SERIAL CLOCK FREQ. (GHz) | DIVIDE SERIAL CLOCK FROM A-CDR BY | FREQUENCY (GHz) | |
| NORMAL 0.2G TO 1.0G | 4 | 0.8 TO 4.0 | 1 | 0.8 TO 4.0 | 22.5° |
| LOW 0.1G TO 0.2G | 8 | 0.8 TO 1.6 | 2 | 0.4 TO 0.8 | |

FIG. 12

DIGITAL PHASE LOCKED LOOP CIRCUITRY AND METHODS

This application is a continuation of U.S. patent application Ser. No. 13/907,158, filed May 31, 2013 (currently allowed), which is a continuation of U.S. patent application Ser. No. 12/974,949, filed Dec. 21, 2010, now U.S. Pat. No. 8,462,908, which is a continuation of U.S. patent application Ser. No. 10/923,129, filed Aug. 20, 2004, now U.S. Pat. No. 7,869,553, which is a continuation-in-part of U.S. patent application Ser. No. 10/349,541, filed Jan. 21, 2003, now U.S. Pat. No. 7,138,837, all of which are hereby incorporated by reference herein in their entireties.

BACKGROUND OF THE INVENTION

This invention relates to phase locked loop ("PLL") circuitry, and more particularly to digital phase locked loop ("DPLL") circuitry.

PLL circuitry is a frequently needed type of circuitry. For example, in the reception of clock data recovery ("CDR") signals, PLL circuitry may be used to help match the frequency and phase of a controllably variable clock signal to the clock information that is embedded in the received CDR signal. The frequency-and-phase-matched clock signal can be used as a "recovered" clock signal, which is useful, for example, in processing the data information that is also recovered from the CDR signal.

PLL circuitry may include a "digital" portion ("DPLL circuitry"). For example, after a frequency match has been achieved, several versions ("candidate clock signals") of the frequency-matched clock signal may be produced. Each of these versions is shifted somewhat in phase relative to the other versions. The digital portion of the PLL circuitry may be used to make a final selection of the version that has the best phase match. Relative stability in such a final selection is important (e.g., to avoid final selections that change too soon (prematurely) or too often ("hunting")). Also, it can be important to avoid "glitches" in the recovered clock signal. Glitches can be associated with certain types of changes in the final selection of the clock signal version to be output as the recovered clock signal. A glitch is typically one or more signal transitions that are fragmentary or too close to one another or to other transitions in the recovered clock signal (i.e., signal transition spacings that are too small a fraction of a proper recovered clock signal cycle).

Although there is a great deal of interest in CDR circuitry that can support serial communication at very high speeds (e.g., at 1.0 GHz and higher), there are also many applications for lower speed serial communication. However, providing low speed analog PLL circuitry can be expensive in terms of integrated circuit area and other resources.

SUMMARY OF THE INVENTION

In accordance with certain aspects of the invention, the one of a plurality of phase-distributed candidate clock signals that is closest in phase to transitions in another signal (e.g., a CDR signal) is selected by preliminarily selecting two of the candidate clock signals that are adjacent to one another in phase and such that at least one of the preliminarily selected signals has no other candidate clock signal with phase between it and the transitions. A final selection is then made between the two preliminarily selected signal, but a change in the final selection is only allowed while both of the preliminarily selected signals have the same polarity.

In accordance with certain other aspects of the invention, apparatus is provided for selecting from a plurality of phase-distributed candidate clock signals the one of those signals that is closest in phase to transitions in another signal such as a CDR signal. The apparatus includes preliminary selection circuitry that selects two of the candidate clock signals that are adjacent to one another in phase, at least one of these preliminarily selected signals having no other candidate clock signal with phase between it and the transitions. The apparatus further includes final selection circuitry that selects the one of the preliminarily selected signals that has phase closer to the transitions, the final selection circuitry being operable to make a change in selection only when both of the preliminarily selected signals have the same polarity.

In accordance with still other aspects of the invention, the one of a plurality of candidate recovered clock signals that is closest in phase to transitions in another signal is selected by preliminarily selecting two of the candidate signals that are adjacent to one another in phase, a first of the preliminarily selected signals having phase earlier than the transitions, and a second of the preliminarily selecting signals having phase later than the transitions. The second preliminarily selected signal is used to clock a final selection request signal through a delay chain, and the final selection request output by the delay chain is used to make a final selection between the preliminarily selected signals.

In accordance with yet another aspect of the invention, apparatus is provided for selecting from a plurality of phase-distributed candidate recovered clock signals the one of those signals that is closest in phase to transitions in another signal, the apparatus including phase detect circuitry for comparing the phase of a currently finally selected one of the candidate recovered clock signals to each of the transitions. The phase detect circuitry produces a first signal if the transition is later than the phase of the currently finally selected signal, and it produces a second signal if the transition is earlier than the phase of the currently finally selected signal. The apparatus further includes digital integrator circuitry for digitally integrating the first and second signals together. The apparatus still further includes preliminary selection circuitry for preliminarily selecting two phase-adjacent ones of the candidate recovered clock signals based on more significant information from the digital integrator circuitry, and final selection circuitry for finally selecting one of the two preliminarily selected signals based on less significant information from the digital integrator circuitry. And the apparatus includes delay circuitry for delaying response of the final selection circuitry to the less significant information relative to response of the preliminary selection circuitry to the concurrently produced, more significant information.

In accordance with further aspects of the invention, the operating range of circuitry for recovering data information from a serial data signal may be extended to frequencies below those economically provided by analog PLL circuitry (or such CDR circuitry may be employed on a serial data signal having a relatively low bit rate) by selectively dividing the frequency of each of several candidate clock signals prior to use of those candidate clock signals to recover the data information from the serial data signal. On the transmit side, over-transmission or over-sampling may be used for similar reasons (i.e., to effectively increase the bit rate of data having a bit rate lower than frequencies that can be economically provided by analog PLL circuitry).

Further features of the invention, its nature and various advantages will be more apparent from the accompanying drawings and the following detailed description.

BRIEF DESCRIPTION OF THE DRAWINGS

FIG. 7 is a chart showing illustrative operating modes and ranges of circuitry of the type shown in FIG. 6 in accordance with the invention.

FIG. 12 is a table showing illustrative modes and ranges of operation of the FIG. 11 circuitry in accordance with the invention.

DETAILED DESCRIPTION

Illustrative circuitries that may employ DPLL circuitry are shown, for example, in Aung et al. U.S. Pat. No. 7,227,918 and Lee et al. U.S. Pat. No. 7,366,267. The circuitries shown in these references are also examples of circuitries in which the circuitry of this invention can be employed. Because these references provide illustrative contexts for the present invention, it will not be necessary herein to go into great detail about such contexts (although FIGS. 4 and 5 herein and the accompanying description of those FIGS. do provide some illustrative context information). For example, it will be assumed in what immediately follows that the input signals to the DPLL circuitry shown herein come from circuitry of the type shown in the references, and similarly that the signals output by the DPLL circuitry shown herein are employed as shown in the references. All context information assumed or provided herein is only illustrative. Many other contexts are also possible.

Figure 1:
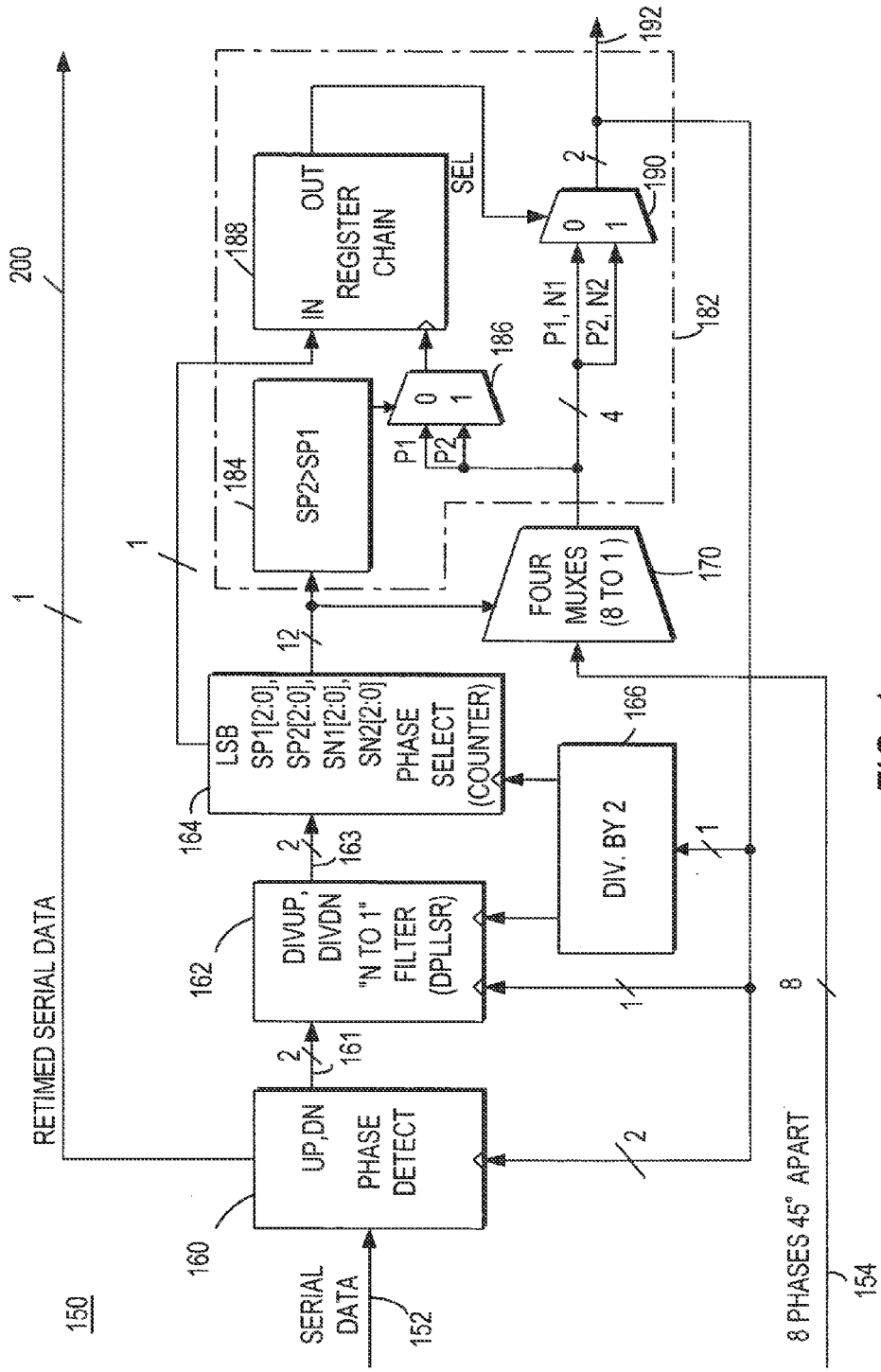
FIG. 1 is a simplified schematic block diagram of an illustrative embodiment of circuitry in accordance with the invention.

Turning now to FIG. 1, DPLL circuitry 150 receives serial data (e.g., a CDR signal) via lead 152. DPLL circuitry 150 also receives eight candidate recovered clock signals via leads 154. These eight candidate recovered clock signals all have the same frequency, which matches the frequency of clock information in the CDR signal on lead 152. However, the phases of the eight candidate recovered clock signals on leads 154 are all different. Preferably the shift in phase from one of these signals to the next is substantially equal to one-eighth of a cycle of any one of these signals. Thus the phase of each of the signals on leads 154 is shifted by 45° from the preceding signal in the group when the signals are ordered on the basis of phase. In other words, the eight signals on leads 154 collectively divide one full cycle of any of these signals into eight equal fractions. DPLL circuitry 150 operates (as will be described later herein) to select two of the eight signals on leads 154 as final recovered clock signals on leads 192. Omitting for the moment details that will be discussed later, the two signals thus finally selected are in general the true and complement of the candidate reference clock signal having the phase that best matches the phase of the clock information in CDR signal 152. Operation of the FIG. 1 circuitry will now be discussed in more detail.

The recovered clock signals on leads 192 are applied as clock signals to phase detect circuitry 160. This circuitry compares the phases of transitions in CDR signal 152 to phases of the recovered clock signals (from leads 192) and produces "UP" or "DN" signal pulses on leads 161, depending on whether the phase of the recovered clock signals needs to be delayed ("UP") or advanced ("DN") to make the recovered clock signals better match the phase of transitions in CDR signal 152. In circuitry 160 the recovered true clock signal may be compared in phase to positive-going transitions in CDR signal 152. The recovered complement clock signal may be compared in phase to negative-going transitions in CDR signal 152.

Circuitry 160 also uses recovered clock signals 192 to produce a retimed serial data signal on lead 200. This may be done, for example, by using an appropriate one (or a phase-shifted version of an appropriate one) of the recovered clock signals to clock CDR signal 152 into a register. The output signal of the register is the retimed serial data signal on lead 200.

Circuitry 162 operates as N-to-1 filter circuitry on the UP and DN signal pulses output by circuitry 160. For example, circuitry 162 may divide by an integer N (which is greater than 1) the number of UP pulses received to produce a "DIVUP" output signal pulse only after N UP pulses have been received. Circuitry 162 may do the same thing with respect to DN pulses, so that a "DIVDN" output signal pulse is produced only after N DN pulses have been received. The DIVUP and DIVDN signals are output via leads 163. A purpose of the filtering provided by circuitry 162 is to avoid reacting to the UP/DN signals before phase detect circuitry 160 has had a chance to examine the previously chosen phase and make an UP/DN decision based on that phase choice. N to 1 filter circuitry 162 is clocked by one of the recovered clock signals from leads 192, and also by a second clock signal that is one of the recovered clock signals 192 after frequency-halving by divide-by-2 circuitry 166. Some functions in circuitry 162 can be clocked at the full recovered clock rate. But other functions, such as synthesized counters, need the slower clock signal produced by divider circuitry 166.

DIVUP and DIVDN signals 163 respectively increment and decrement a counter in phase select circuitry 164. Circuitry 164 is also clocked by a frequency-halved recovered clock signal produced by divider circuitry 166. It will be appreciated that elements 162 and 164 effectively low-pass-filter and digitally integrate the UP and DN signals together (over time) to help smooth out the response of the circuitry to indications of need to change the phase of the recovered clock signal. It will also be appreciated that, in the particular embodiment being described, UP and DN signals are only produced in response to transitions in CDR signal 152. In the absence of further transitions in the CDR signal, the circuitry is therefore stable with respect to any recovered clock signal selection that has been made. As a consequence, the illustrative circuitry does not require CDR signal 152 to comply with any particular run length limitation. Run length monitoring circuitry can be added if desired.

The more significant bits ("MSB") of the count from the counter in circuitry 164 control "preliminary" selection of two pairs of two of the eight candidate recovered clocks 154. The two candidate recovered clock signals in each pair have phases that are separated by 45°, and the pairs are 180° out of phase with one another (i.e., the more phase-retarded signal in each pair is 180° out of phase with the more phase-retarded signal in the other pair, and the same is true for more phase-advanced signal in each pair). In the immediately following discussion we will first give primary consideration to only one of the above-mentioned pairs (i.e., the signals referred to as P1 and P2). Later we will come back and supplement the consideration of the other pair (i.e., the signals referred to as N1 and N2).

Considering first the selection of signals P1 and P2, these are two phase-adjacent ones of the eight candidate recovered clock signals on leads 154. These two selected signals are "phase-adjacent" because they have the smallest possible phase difference (45°) between them. At various times during operation of the circuitry, any two candidate recovered clock signals, separated in phase by 45°, may be selected as P1 and P2 based on the MSB of the circuitry 164 counter. At any given time, however, (after the circuitry has been in operation long enough to have reached reasonable stability) the two candidate recovered clock signals that are selected as P1 and P2 by the MSB of the circuitry 164 counter are the two signals having phases that most nearly match the phase of positive-going transitions in the clock information in CDR signal 152. This generally means that one of the selected signals will have phase that is somewhat behind the phase of positive-going transitions in the CDR signal clock, and the other selected signal will have phase that is somewhat ahead of the phase of positive-going transitions in the CDR signal clock. In other words, the circuitry attempts to keep the phase of positive-going transitions in the CDR signal clock information between the phases of the two candidate recovered clock signals selected as P1 and P2 by the MSB of the circuitry 164 counter.

Multiplexer circuitry 170 actually makes the selection of the two candidate recovered clock signals P1 and P2 as described in the preceding paragraph. Multiplexer circuitry 170 is controlled to make these selections by SP1[2:0] and SP2[2:0] output signals of phase select circuitry 164. These SP1 or SP2 signals are derived from the above-described MSB information. Although any other consistent convention could be used, in the illustrative embodiment being described herein, the higher the value represented by SP1 or SP2, the later (more delayed) the phase of the candidate recovered clock signal that will be selected in response to that SP1 or SP2 value. As has already been anticipated, the two signals selected by the SP1 and SP2 signals are respectively referenced P1 and P2 in FIG. 1.

Only one of the two sets of signals SP1 and SP2 is allowed to change at any one time. For example, if SP1 and SP2 are selecting candidate recovered clock signals P1 and P2 having phases that are respectively behind and ahead of the CDR signal clock information phase, and if it is then found that the phase of P2 is now also behind the phase of the CDR signal clock information, SP2 (and therefore P2) does not change. Only SP1 (and therefore P1) changes. In particular, the change in SP1 is from selecting the candidate signal having phase behind the phase of P2 to selecting the candidate signal having phase ahead of the phase of P2. In this way the phase of the CDR clock information remains between the phases of P1 and P2, but only one signal selection (in this example the selection of P1) changes at any one time. Thus there is always one set of signals SP1 or SP2 that is unchanged during any change in the other set of the SP1/SP2 signals. By the same token, there is always one of signals P1 or P2 that is uninterruptedly output by circuitry 170 during any change in the other P1/P2 signal output by that circuitry.

At the same time that multiplexer circuitry 170 is selecting P1 and P2 as described above, that circuitry also selects the complements of P1 and P2 (referred to as N1 and N2, respectively). (All "complement" signals are 180° out of phase with the corresponding "true" signal.) The SN1[2:0] and SN2[2:0] output signals of phase select circuitry 164 control circuitry 170 to make these complement signal selections.

A final selection of one of signals P1 and P2 for use as the recovered clock signal is made by so-called digital interpolator circuitry 182. Within circuitry 182, circuitry 184 compares the SP1 and SP2 information. If SP2 is greater than SP1, the phase of P2 is later (more retarded or delayed) than the phase of P1. In that case compare circuitry 184 causes multiplexer circuitry 186 to select P2 for application to the clock input terminal of register chain 188. On the other hand, if SP1 is greater than SP2, the phase of P1 is later (more retarded or delayed) than the phase of P2. In that case compare circuitry 184 causes multiplexer circuitry 186 to select P1 for application to the clock input terminal of register chain 188. From the foregoing it will be seen that multiplexer circuitry 186 always outputs the one of signals P1 and P2 with the later phase. It will also now be appreciated why it is desirable for only one set of signals SP1 or SP2 to be allowed to change at any one time (e.g., to increase the reliability of operation of comparison circuitry 184).

The data input to register chain 188 is a less significant bit ("LSB") of the count in the above-described counter in phase select circuitry 164. The LSB information can be the least significant bit of the count in the circuitry 164 counter, or if there are several bits in that counter with significance less than the previously described MSB information, the LSB can be one of those less significant bits (preferably the bit with significance just less than the MSB information). The LSB signal propagates through register chain 188 at the rate of the clock signal (P1 or P2) applied to the clock input of that chain from the output of multiplexer 186. After thus propagating through register chain 188, the LSB signal information is output by that chain as final selection signal SEL. The SEL signal is used to control multiplexer circuitry 190 to select either P1 and N1 or P2 and N2 as the recovered clock signal and its complement. In particular, if SEL is 0, circuitry 190 selects P1 and N1 for application to leads 192. If SEL is 1, circuitry 190 selects P2 and N2 for application to leads 192.

Reviewing the operation of the circuitry from a relatively high level, the phase of the clock signal applied to register chain 188 can change by no more than 45° at any one time. This helps register chain 188 continue to operate satisfactorily during any change in the signal selected by multiplexer 186. Register chain 188 delays the time between any change in the LSB information and the use of that information (as SEL) to cause a change in the selection of P1/N1 or P2/N2 for application to leads 192. If the MSB and LSB information both change at the same time, the delay in use of the LSB information that results from passing that information through register chain 188 prior to use to control multiplexer 190 prevents a change in candidate clock signal selection by multiplexer 190 from occurring too close in time to a change in candidate clock signal selection by more upstream multiplexers 170 and 186. This means that any change in ("preliminary") selections by multiplexers 170 and 186 has been made and the results of those selections have been well stabilized before any change in further ("final") selection among those preliminary selections can be attempted and made by multiplexer 190. Ensuring in this way that the initial or preliminary selections (by multiplexers 170 and 186) and the final selections (by multiplexer 190) are well spaced apart in time helps ensure that the final selections (the recovered clock signals on leads 192) are free of "glitches", even when those final selections change, as they typically do at least from time to time. After the immediately following additional point, further glitch-preventing aspects of the circuitry will be discussed in connection with FIG. 2.

Before leaving FIG. 1, it should be pointed out (if it is not already apparent from what has been said) that whenever a change is made in the preliminary selections by multiplexer circuitry 170, the LSB information will typically already be causing multiplexer circuitry 190 to finally select the signals P1/N1 or P2/N2 that will not change as a result of the preliminary selection change. This is so because (as has been said) only one of the two sets of signals preliminarily selected by multiplexer circuitry 170 is allowed to change at any one time. Moreover, the set that is allowed to change is the set that is more distant in phase from transitions in CDR signal 152. But before that preliminary selection change occurs, the LSB/SEL information will have caused the final selection (via operation of multiplexer circuitry 190) to be selection of the preliminarily selected set that is closer in phase to transitions in CDR signal 152. So, although a change in preliminary selection is immediately reflected at one set of the inputs to multiplexer circuitry 190, that has no immediate effect on the outputs of circuitry 190 because SEL is then causing circuitry 190 to derive its outputs from its other set of inputs. And there is no change in the signals applied to that other set of circuitry 190 inputs. Only well after a change in one of the sets of inputs to circuitry 190 can SEL change to cause final selection of that changed set of inputs. This is ensured by operation of delay circuitry 188, which delays any change in LSB prior to appearance of that change in SEL. This description, of course, assumes normal operation of the circuitry.

Figure 2:
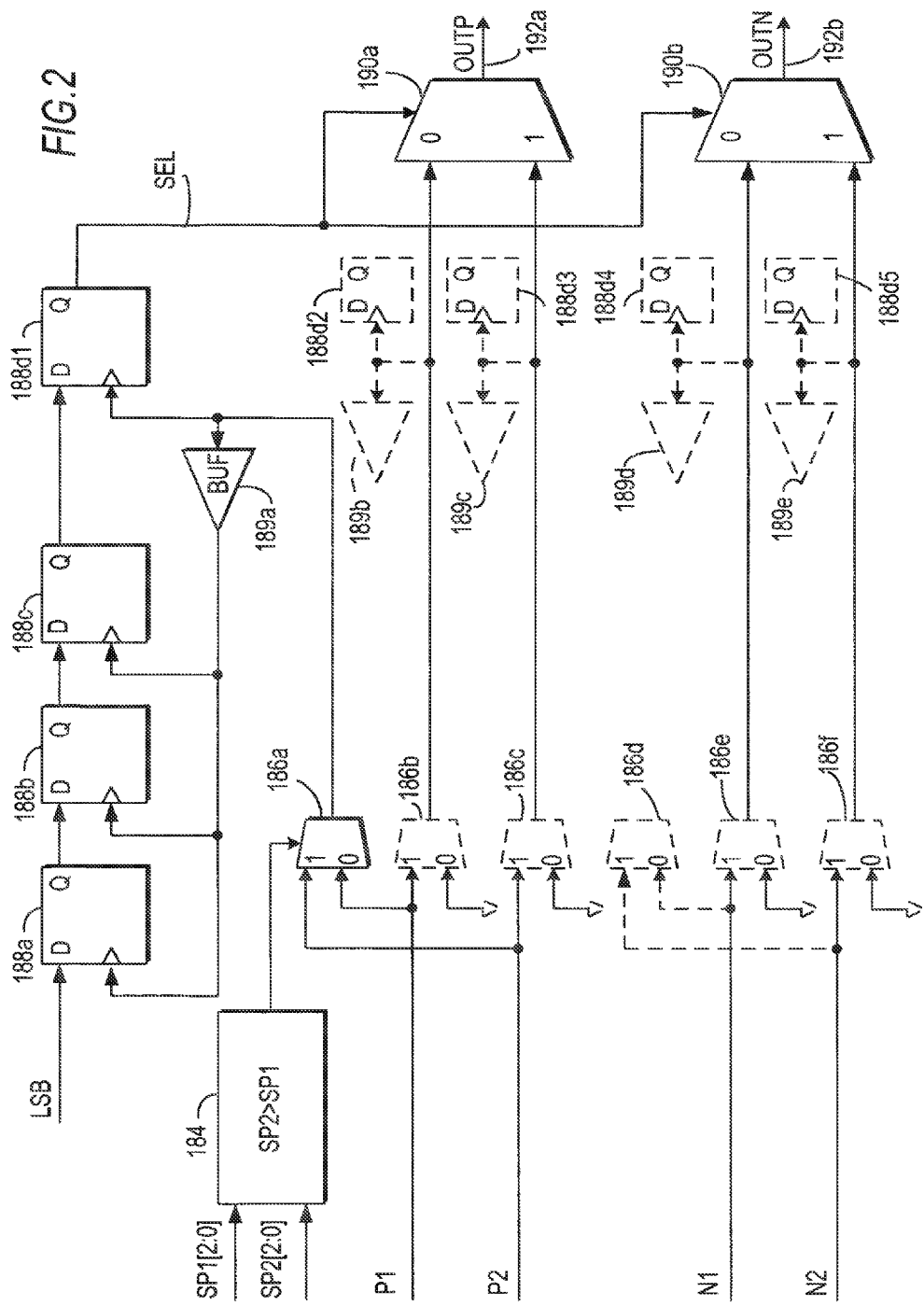
FIG. 2 is a more detailed, but still simplified schematic block diagram of an illustrative embodiment of a portion of the FIG. 1 circuitry in accordance with the invention.

Turning now to FIG. 2, that FIG. shows an illustrative embodiment of digital interpolator circuitry 182 in somewhat more detail. The portions of this circuitry that relate to selection of OUTP (the finally selected recovered clock on lead 192*a*) will be discussed first. Then the similar circuitry for selecting the complement of OUTP (i.e., OUTN on lead 192*b*) will be discussed.

As has already been said, the final selection between P1 and P2 is controlled by LSB. An LSB transition should not cause a glitch in the output clock OUTP (or OUTN). To prevent such a glitch, LSB is forced to transition at the final output mux 190*a* only when P1 and P2 are the same logic state (high or low). (The same is true for N1 and N2, i.e., they are forced to be in the same logic state when LSB transitions at final output mux 190*b*.)

First, SP1 and SP2 are compared in circuitry 184, and the later phase clock among P1 and P2 is selected to register LSB. For example, if SP1=2 and SP2=1, then the phase of P1 is greater (later) than the phase of P2 and therefore P1 is selected to register LSB.

Figure 3:
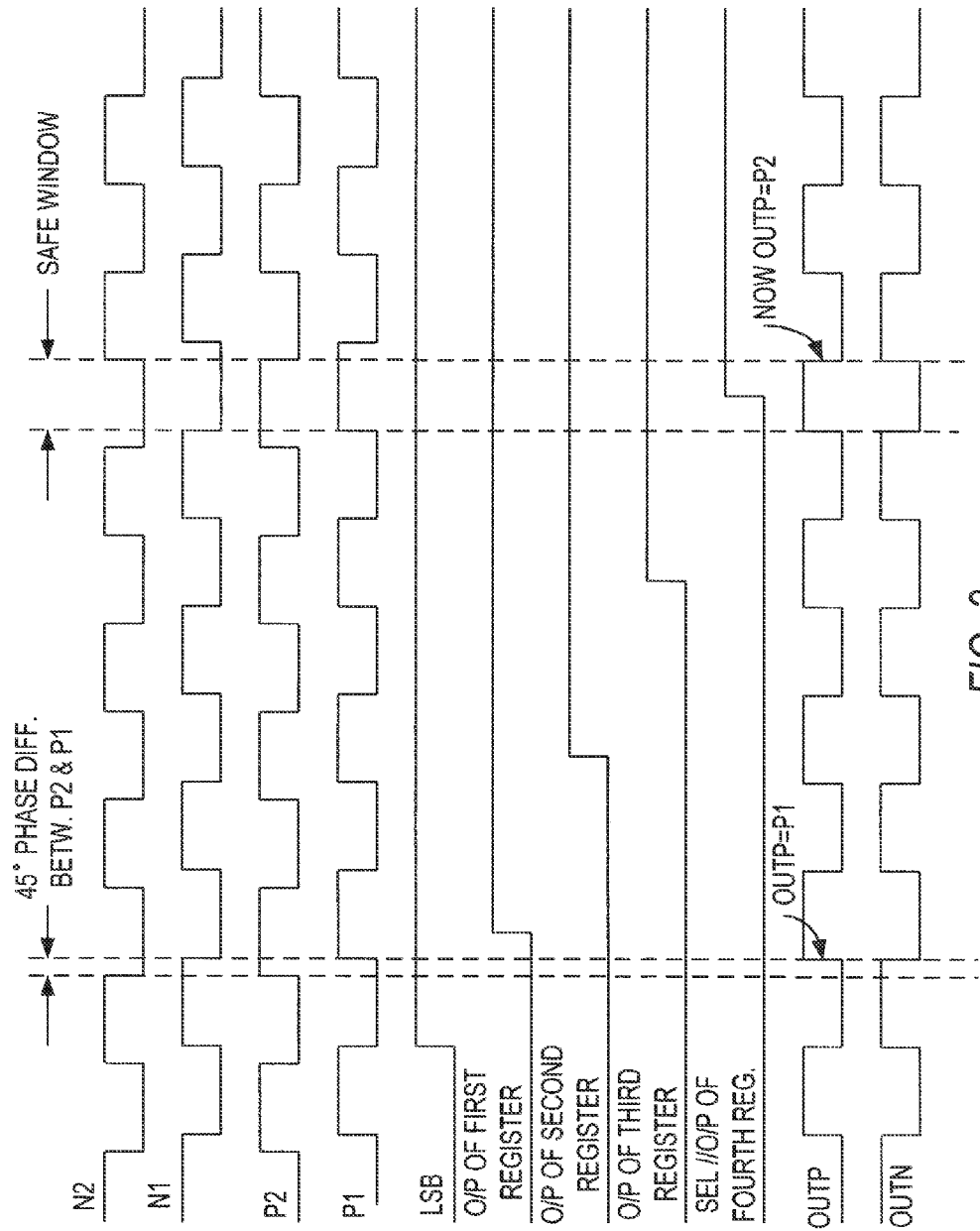
FIG. 3 shows several illustrative signal waveforms that are useful in explaining certain aspects of the invention. All of these waveforms are drawn with reference to a common horizontal time-line, along which time increases to the right.

The waveforms in FIG. 3 illustrate the glitch-free operation of the circuit in FIG. 2. The "safe window" in FIG. 3 shows the area where SEL is guaranteed to switch. As can be seen from FIG. 3, P1=P2 and N1=N2 in this safe window. This ensures that SEL changing state and causing a change in the sources of output clocks OUTP and OUTN does not cause a glitch in OUTP and OUTN (because both possible sources for each of those signals then have the same logic level).

Another characteristic of the circuitry that helps to ensure glitch-free operation is that the TCO (time from clock to output) of shift register stage 188*d*1 (FIG. 2) plus TSEL (time from a change in SEL to a change in the output of the multiplexers 190*a* and 190*b* controlled by SEL) is less than the "safe window" Also, the dummy loads (shown in dashed lines in FIG. 2 (e.g., multiplexers 186*b-f*, registers 188*d*2-5, and buffers 189*b-e*)) help to match the delays between the five clocks (i.e., P1, P2, N1, N2, and the clock to the fourth register 188*d*1 in register chain 188*a*-188*d*1).

Figure 4:
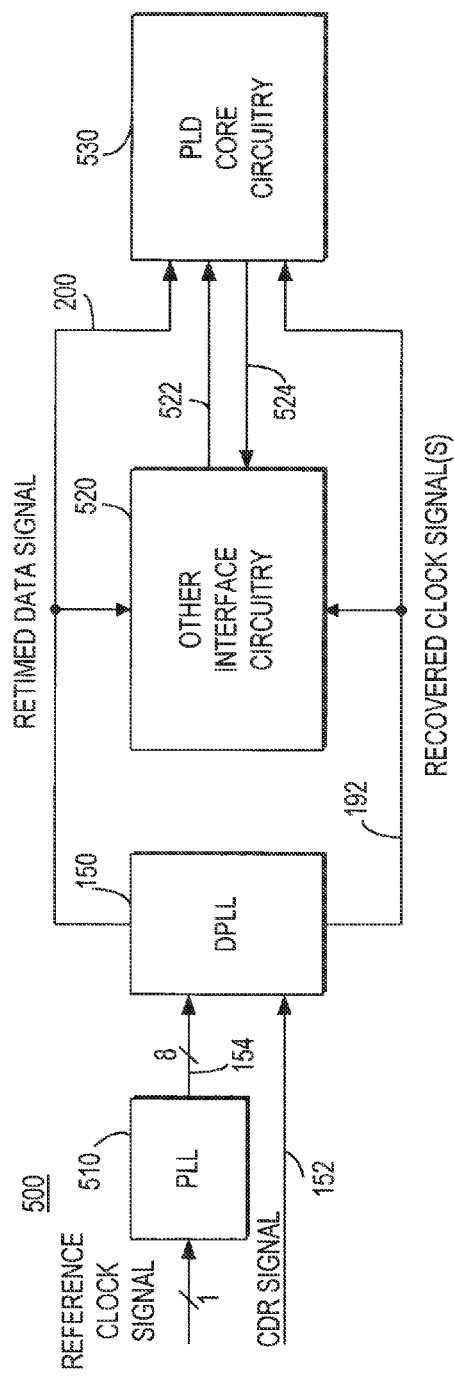
FIG. 4 is a simplified block diagram of illustrative, more extensive circuitry that can include circuitry of the type shown in FIG. 1 in accordance with the invention.

Illustrative circuitry 500 in which DPLL circuitry as described above can be used in accordance with the invention is shown in FIG. 4. Circuitry 500 is assumed to be programmable logic device ("PLD") circuitry. Phase locked loop ("PLL") circuitry 510 receives a reference clock signal having frequency related to the frequency of the clock information in the CDR signal 152 also received by circuitry 500. For example, the reference clock signal frequency can be the same as the frequency of the CDR signal clock information, or there can be an integer multiple relationship between these two frequencies. PLL 510 produces the above-described eight candidate recovered clock signals on leads 154. DPLL 150 uses the signals on leads 154 and CDR signal 152 to produce final recovered clock signal(s) 192 and retimed data signal 200. These signals may be used and/or further processed in other interface circuitry 520, and/or they may be applied to PLD core circuitry 530 (e.g., the general-purpose programmable logic circuitry of PLD 500). Examples of other interface circuitry 520 that may be included are (1) byte alignment circuitry, (2) 8-bit/10-bit decoding circuitry, (3) channel de-skew circuitry, (4) byte de-serializer circuitry, (5) decryption circuitry, etc. Examples of such possible other interface circuitry 520 are shown in such references as Aung et al. U.S. Pat. No. 7,227,918, Lee et al. U.S. Pat. No. 7,366,267, Lee et al. U.S. Pat. No. 6,650,140, Venkata et al. U.S. Pat. No. 6,750,675, Venkata et al. U.S. Pat. No. 7,180,972, Venkata et al. U.S. Pat. No. 6,854,044, and Venkata et al. U.S. Pat. No. 7,305, 058. Other interface circuitry 520 may exchange signals with PLD core circuitry 530 via leads 522 and 524. For example, signals for controlling certain operations of circuitry 520 may come from PLD core circuitry 530 via leads 524. Further processed data signals and/or signals indicating the status of various aspects of circuitry 520 operation may be applied to circuitry 530 via leads 522. There may be still other connections (not shown) between various elements in FIG. 4. For example, PLL 510 and/or DPLL 150 may indicate "loss of lock" to circuitry 530. As another example, DPLL 150 may include circuitry for monitoring the run length of CDR signal 152 and may indicate any "run length violation" to circuitry 530.

Figure 5:
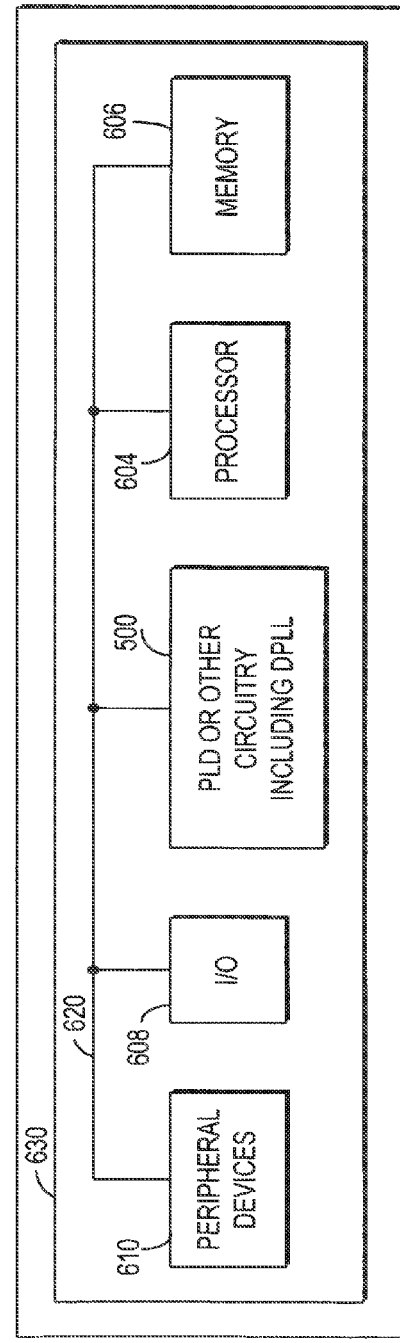
FIG. 5 is a simplified block diagram of an illustrative system employing circuitry in accordance with the invention.

FIG. 5 illustrates a PLD or other circuitry 500 like that illustrated by FIG. 4 in a data processing system 602 in accordance with the invention. Data processing system 602 may include one or more of the following components: a processor 604; memory 606; I/O circuitry 608; and peripheral devices 610. These components are coupled together by a system bus or other interconnections 620 and are populated on a circuit board 630 (e.g., a printed circuit board), which is contained in an end-user system 640. Any of the interconnections between element 500 and any other elements may be made using the above-described CDR signaling.

System 602 can be used in a wide variety of applications, such as computer networking, data networking, instrumentation, video processing, digital signal processing, or any other application where the advantage of using programmable or reprogrammable logic is desirable. Circuitry 500 can be used to perform a variety of different logic functions. For example, circuitry 500 can be configured as a processor or controller that works in cooperation with processor 604. Circuitry 500 may also be used as an arbiter for arbitrating access to a shared resource in system 602. In yet another example, circuitry 500 can be configured as an interface between processor 604 and one of the other components in system 602. It should be noted that system 602 is only exemplary, and that the true scope and spirit of the invention should be indicated by the following claims.

Figure 6:
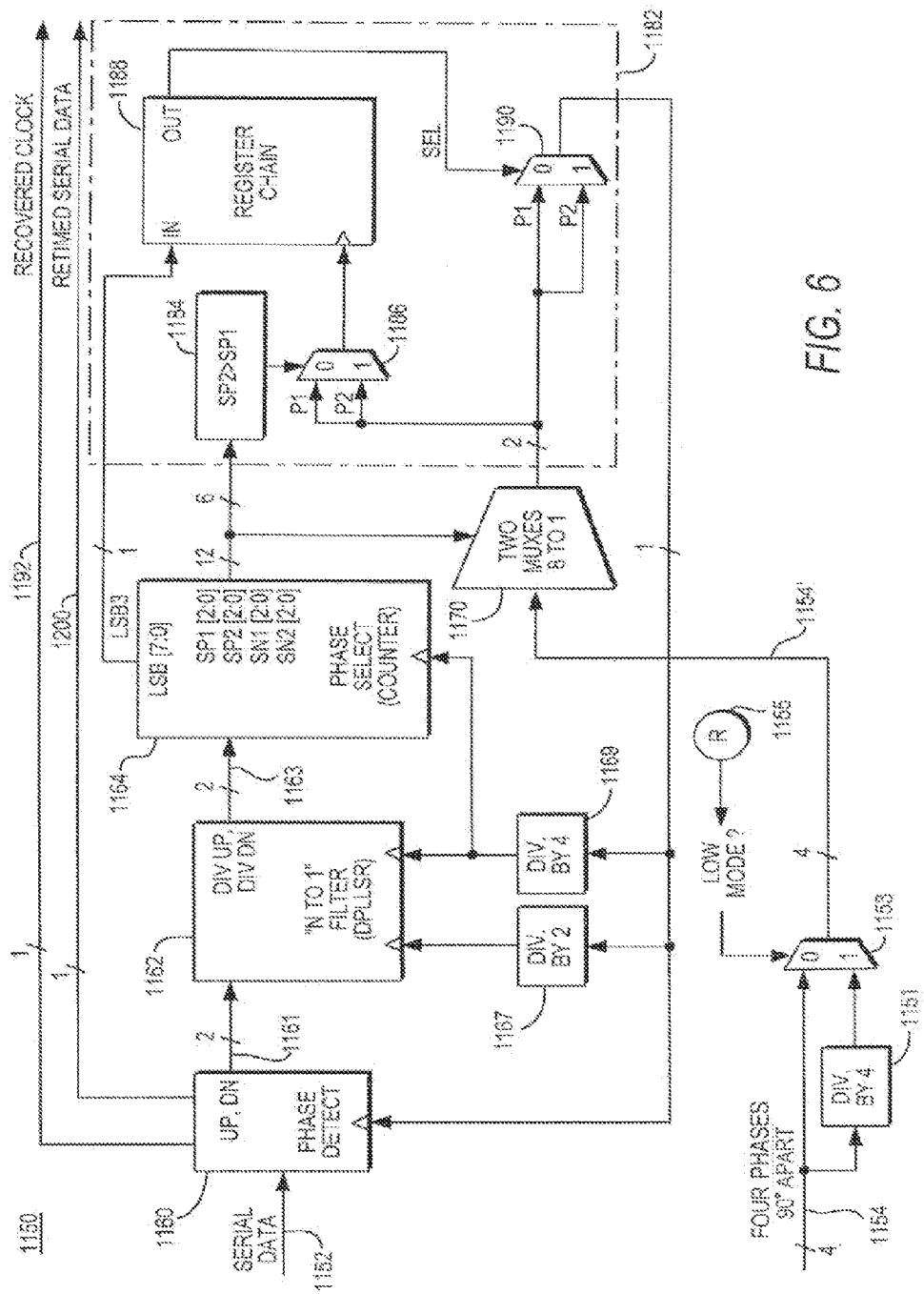
FIG. 6 is a simplified schematic block diagram generally similar to FIG. 1, but showing an illustrative embodiment of alternative or additional circuitry in accordance with the invention.

In the embodiments shown and described thus far it is assumed that the serial data rate is high enough that PLL 510 (FIG. 4) can economically operate at that frequency. However, there are many possible applications of CDR technology in which the serial data rates are lower than analog CDR circuitry (e.g., including analog PLL circuitry 510) can economically support. For example, providing analog CDR circuitry that can operate at low frequencies (e.g., below about 0.5 GHz (although this number can be more or less, depending on circuit configuration)) may be prohibitively expensive in integrated circuit area and power requirements. FIG. 6 shows an illustrative embodiment of the invention in which the operating range of circuitry of the type discussed herein can be digitally extended at the lower end. This digital low-range extension for analog CDR circuitry avoids the need for analog circuitry that can operate at relatively low frequencies and that may, as a consequence, be expensive to provide in terms of the types of resources mentioned earlier in this paragraph.

The circuitry shown in FIG. 6 has many similarities in terms of construction and operation to the circuitry shown in FIG. 1. Elements in FIG. 6 that are similar to elements in FIG. 1 have FIG. 6 reference numbers that are increased by 1000 relative to the corresponding FIG. 1 element reference numbers. Because of the similarity of what is shown in FIG. 6 to what is shown in FIG. 1 and fully described earlier in this specification, it will not be necessary to describe all aspects of FIG. 6. For the most part, only respects in which FIG. 6 differs from FIG. 1 will be described. It will be understood that other aspects of FIG. 6 are covered by the description of corresponding aspects of FIG. 1.

Also in conjunction with FIG. 6, FIG. 7 should be considered. FIG. 7 is a table showing certain aspects of the operation of FIG. 6 in two modes of such operation. The first of these modes is called "normal" mode. The second mode is called "low" mode. Both of these modes support serial data rates that can be lower than the lowest serial data rate supported by similarly constructed circuitry as shown in FIG. 1. FIG. 7 assumes that the lowest analog CDR (A-CDR or ACDR) serial clock frequency permitted is 0.5 GHz (500 MHz). In the normal mode shown in FIG. 7 the serial data rate can be anywhere from 0.25 Gpbs to 1.0 Gpbs. This mode uses a serial clock frequency that is twice the serial data rate (i.e., anywhere from 0.5 GHz to 2.0 GHz). In the low mode shown in FIG. 7 the serial data rate can be anywhere from 0.1 Gpbs to 0.25 Gbps. This mode uses a serial clock frequency that is eight times the serial data rate (i.e., anywhere from 0.8 GHz to 2.0 GHz). It will thus be seen that these modes keep the serial clock frequency at or above 0.5 GHz, but allow the serial data rate to be significantly lower than 0.5 Gpbs, if that is desired. It should be noted that in both normal mode and low mode the ratio between the serial bit rate and the "DPLL 8-phase clock" frequency is always 1 to 2. In other words, the "DPLL 8-phase clock" frequency is always twice the serial bit rate.

Returning to FIG. 6, in this embodiment instead of operating with eight candidate clock signals (with 45° phase spacing) from ACDR circuitry 510 (FIG. 4) as in FIG. 1, four candidate clock signals 1154 (with 90° phase spacing) from ACDR circuitry 510 are used. If normal mode is desired, these four candidate clock signals pass through multiplexer circuitry 1153 to leads 1154' with no change in frequency. If low mode is desired, multiplexer circuitry 1153 is switched to apply the outputs of element 1151 to leads 1154'. Element 1151 divides the frequency of each of the four candidate clock signals by four. The selection control lead of multiplexer circuitry 1153 may be controlled by a programmable element 1155 (e.g., a RAM cell) associated with the circuitry. The remainder of the discussion of FIG. 6 (and its related FIGS.) is the same whether the clock signals on leads 1154' have the same frequency as the signals on leads 1154 or one-quarter the frequency of the signals on leads 1154.

Figure 8:
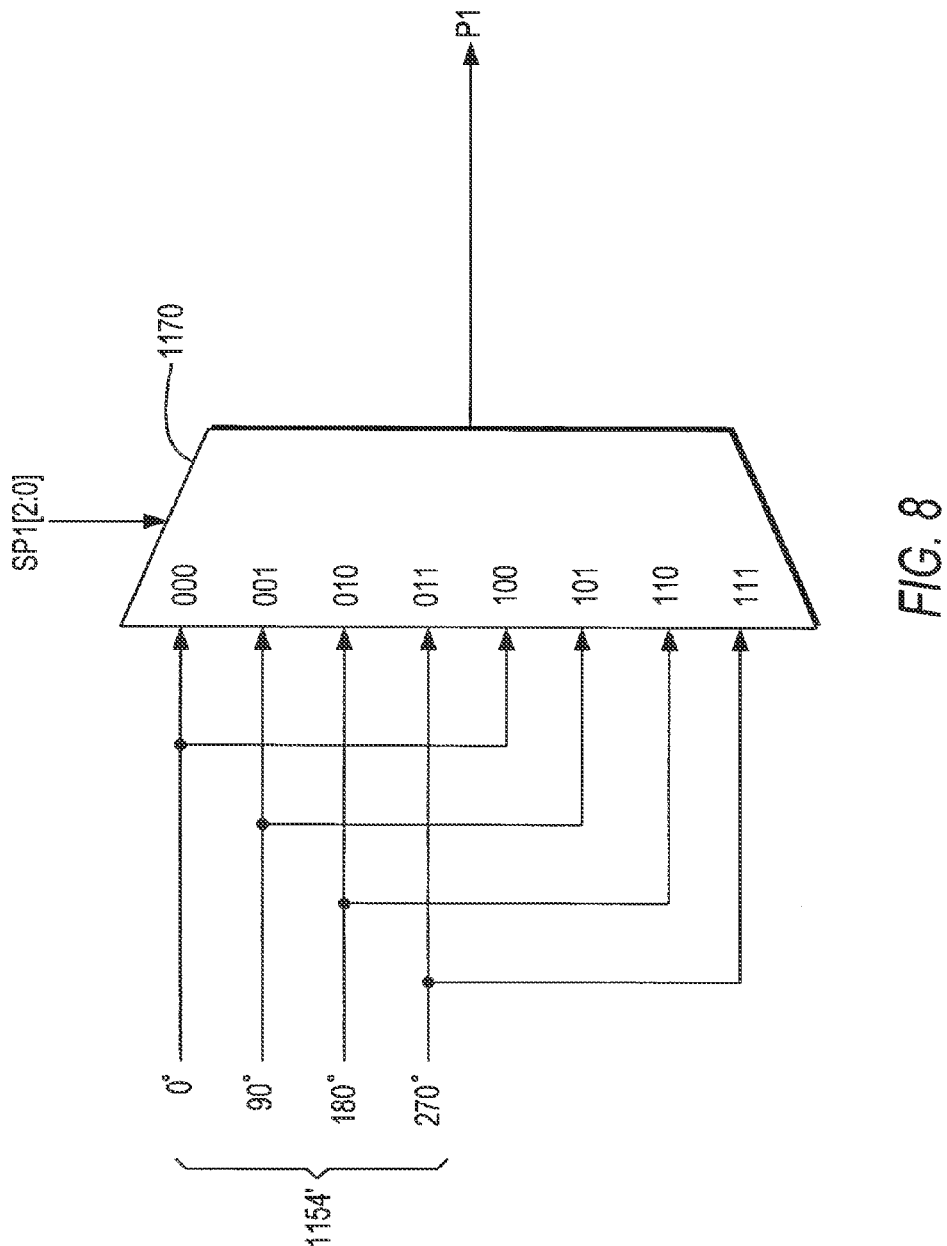
FIG. 8 is a simplified schematic block diagram showing an illustrative embodiment of a representative one of some elements that are employed in FIG. 6 in accordance with the invention.

FIG. 8 shows a representative one of two 8 to 1 multiplexers 1170 in FIG. 6 in more detail. This multiplexer is the one that uses the SP1[2:0] signals from phase select circuitry 1164 (FIG. 6) to select further candidate clock signal P1 from candidate clock signals 1154'. FIG. 8 shows the four signals 1154' with respective relative phases 0°, 90°, 180°, and 270°. FIG. 8 shows that these four signals 1154' are each used twice (i.e., by each being applied to two input terminals of multiplexer 1170). Moreover, the second application of each signal to multiplexer 1170 is at what is effectively 360° phase spacing from the first application. Thus the phasing of the second applications of the 0°, 90°, 180°, and 270° signals looks like phasing of 360°, 450°, 540°, and 630°, respectively. Multiplexer 1170 selects the 0° signal to output as P1 when the SP1[2:0] signals are 000 (or 100). Multiplexer 1170 selects the 90° signal to output as P1 when the SP1[2:0] signals are 001 (or 101). Other selections made by multiplexer 1170 will be apparent from these examples.

The construction and operation of the multiplexer 1170 that is controlled by the SP2[2:0] signals to select further candidate clock signal P2 can be similar to what has been described for the multiplexer controlled by the SP1[2:0] signals. (Although FIG. 6 shows SN1[2:0] and SN2[2:0] signals also being generated in circuitry 1164, these signals are not actually used in this embodiment.)

Figure 9:
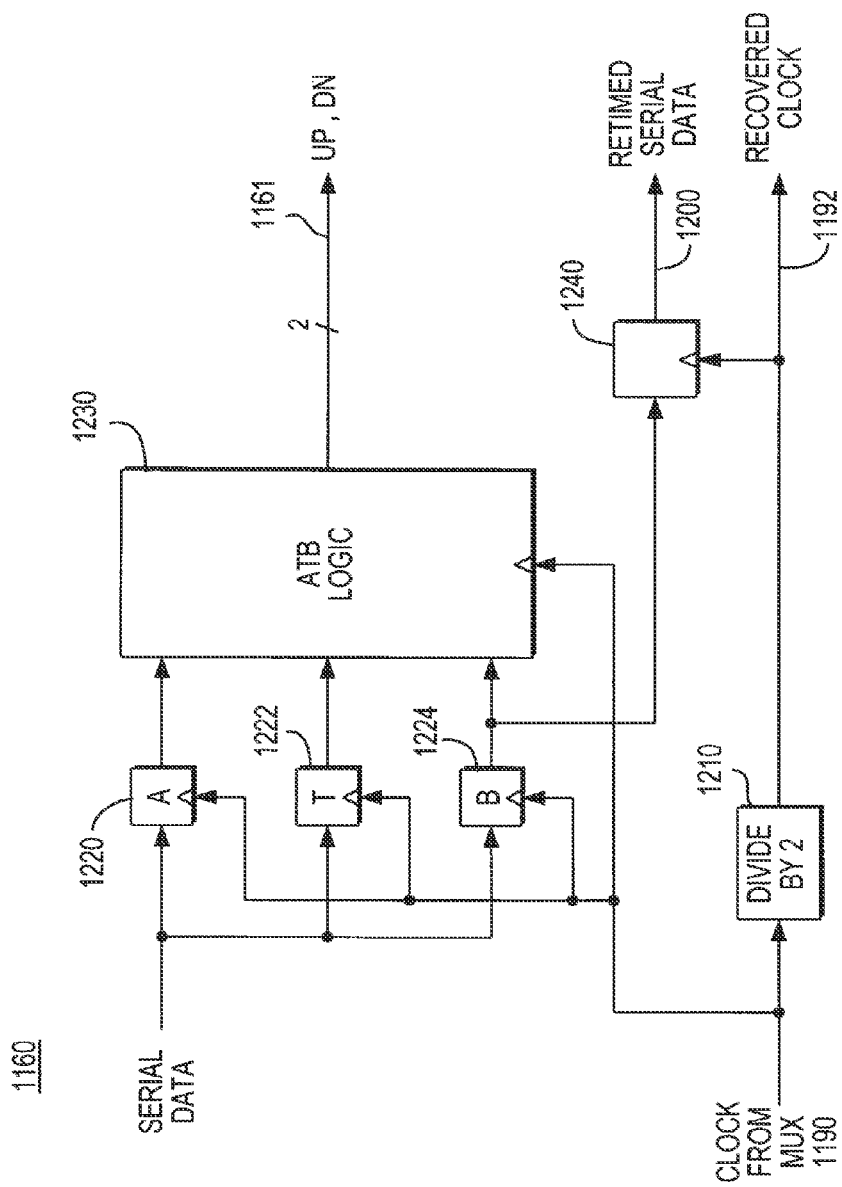
FIG. 9 is a simplified block diagram of an illustrative embodiment of another element that is employed in FIG. 6 in accordance with the invention.

An illustrative embodiment of phase detector 1160 (FIG. 6) is shown in FIG. 9. Divide by 2 circuitry 1210 receives the clock signal output by digital interpolator circuitry 1182 and divides the frequency of that clock signal by 2. The output signal of circuitry 1210 is recovered clock signal 1192. The clock signal applied to circuitry 1210 is also applied as a clock signal to registers 1220, 1222, and 1224, and to ATB logic 1230. Register 1220, 1222, and 1224 are also known as registers A, T, and B, respectively. The serial data signal is applied to each of registers 1220, 1222, and 1224, and is accordingly sampled at each positive-going transition in the clock signal applied to those registers.

Figure 10:
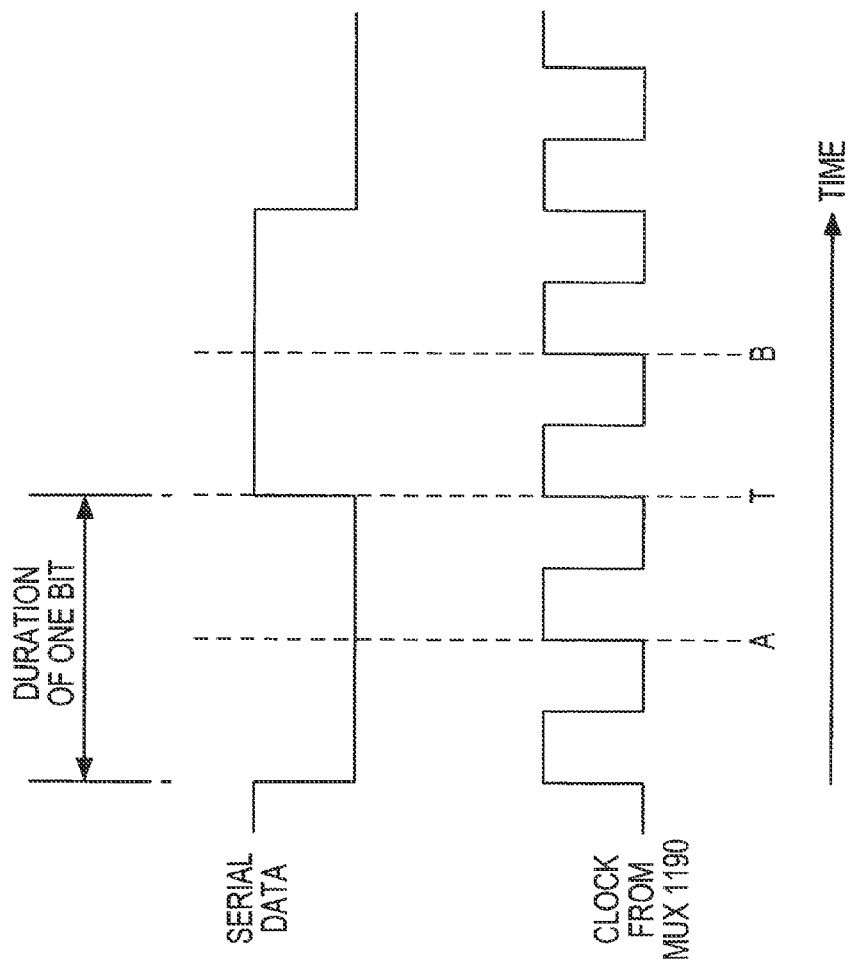
FIG. 10 shows illustrative, simplified signal waveforms that are useful in explaining certain aspects of the operation of the element shown in FIG. 9 in accordance with the invention.

FIG. 10 shows illustrative sampling of the serial data in circuitry 1160. The A sample in FIG. 10 is derived from register 1220 in FIG. 9. The T sample in FIG. 10 is derived from register 1222 in FIG. 9. The B sample in FIG. 10 is derived from register 1224 in FIG. 9. Each of registers 1220-1224 in FIG. 9 actually takes more samples than are highlighted by the letters A, T, and B in FIG. 10, but ATB logic 1230 (FIG. 9) generally considers only every fourth sample taken by each of these registers. In particular, ATB logic 1230 only considers samples like sample A from register 1220, samples like sample T from register 1222, and samples like sample B from register 1224. Samples like A may be thought of as "ahead" (in phase) of positive-going transitions in the serial data signal. Samples like B may be thought of as "behind" (in phase) positive-going transitions in the serial data signal. Samples like T may be thought of as (approximately) at or concurrent with positive-going transitions in the serial data signal.

ATB logic 1230 (FIG. 9) examines each group of samples like A, T, and B in FIG. 10 to determine whether to output an UP or DN output signal pulse. ATB logic 1230 can operate in many different ways (and can have any of many different configurations appropriate to the desired operation), but the following will be given as one possible example. First, ATB logic 1230 looks for three consecutive samples in which sample A (from register 1220 (FIG. 9)) is low and sample B (from register 1224 (FIG. 9)) is high. When ATB logic 1230 finds samples A and B satisfying this criterion, the ATB logic then examines the level of the intervening sample T (from register 1222 (FIG. 9)). If sample T is low, it was taken ahead of or earlier than the positive-going transition in the serial data signal, and an UP signal is output to indicate a need to increase the phase angle of the sampling clock signal. If sample T is high, it was taken behind or later than the positive-going transition in the serial data signal, and a DN signal is output to indicate a need to decrease the phase angle of the sampling clock signal.

FIG. 9 also shows the output of B register 1224 being sampled in synchronism with the recovered clock signal by further register circuitry 1240. The output signal of register 1240 is retimed serial data signal 1200.

Returning to FIG. 6, comparison of that FIG. with FIG. 1 reveals the differences that will now be discussed (in addition to the already-discussed differences in the clock signals going into multiplexers 1170). Wherever in FIG. 1 the circuitry uses the output of mux 190, the FIG. 6 circuitry uses the comparable signal (output by mux 1190) after frequency division by 2. In phase detector 1160 this frequency division is performed by circuitry 1210 (FIG. 9). To the left-hand clock input to circuitry 1162 this frequency division is performed by circuitry 1167. Similarly, wherever in FIG. 1 the circuitry uses the output of mux 1190 after frequency division by 2, the FIG. 6 circuitry uses the comparable signal after frequency division by 4 (as performed by circuitry 1169).

Another difference between the FIG. 1 and FIG. 6 circuitries is that whereas in FIG. 1 multiplexer circuitry 190 selects and outputs both true and complement clock signals 192, in FIG. 6 multiplexer circuitry 1190 selects and outputs only one (true) clock signal.

The last-mentioned difference between FIGS. 1 and 6 should perhaps be amplified as follows. Because the FIG. 1 circuitry outputs from multiplexer circuitry 190 both true and complement clock signal selections 192, clock signals in this type of circuitry must have a 50% duty cycle. This requirement is substantially relaxed in circuitry of the type shown in FIG. 6, in which (effectively) only a true clock signal is output by multiplexer circuitry 1190. Relaxing the FIG. 1 requirement for 50% duty cycle clocks simplifies the FIG. 6 circuitry relative to FIG. 1. Selecting (at mux 1190) and using (e.g., in phase detector 1160) only one (true) clock signal also simplifies the FIG. 6 circuitry relative to FIG. 1.

Except for the differences discussed above, the FIG. 6 circuitry operates in the general manner described above in connection with FIG. 1. The applicable portions of the FIG. 1 discussion will therefore not need to be repeated here for FIG. 6. It will be sufficient to sum up the discussion of FIG. 6 by reiterating that this embodiment allows the serial data rate (signal on lead 1152) to be either one-half or one-eighth the ACDR clock signal frequency (signals on leads 1154). (The one-half relationship applies when circuitry 1151 is not in use, and the one-eighth relationship applies when circuitry 1151 is in use.) This can help avoid the need for low-speed ACDR clock circuitry when it is desired to work with relatively low serial data rates.

Figure 11:
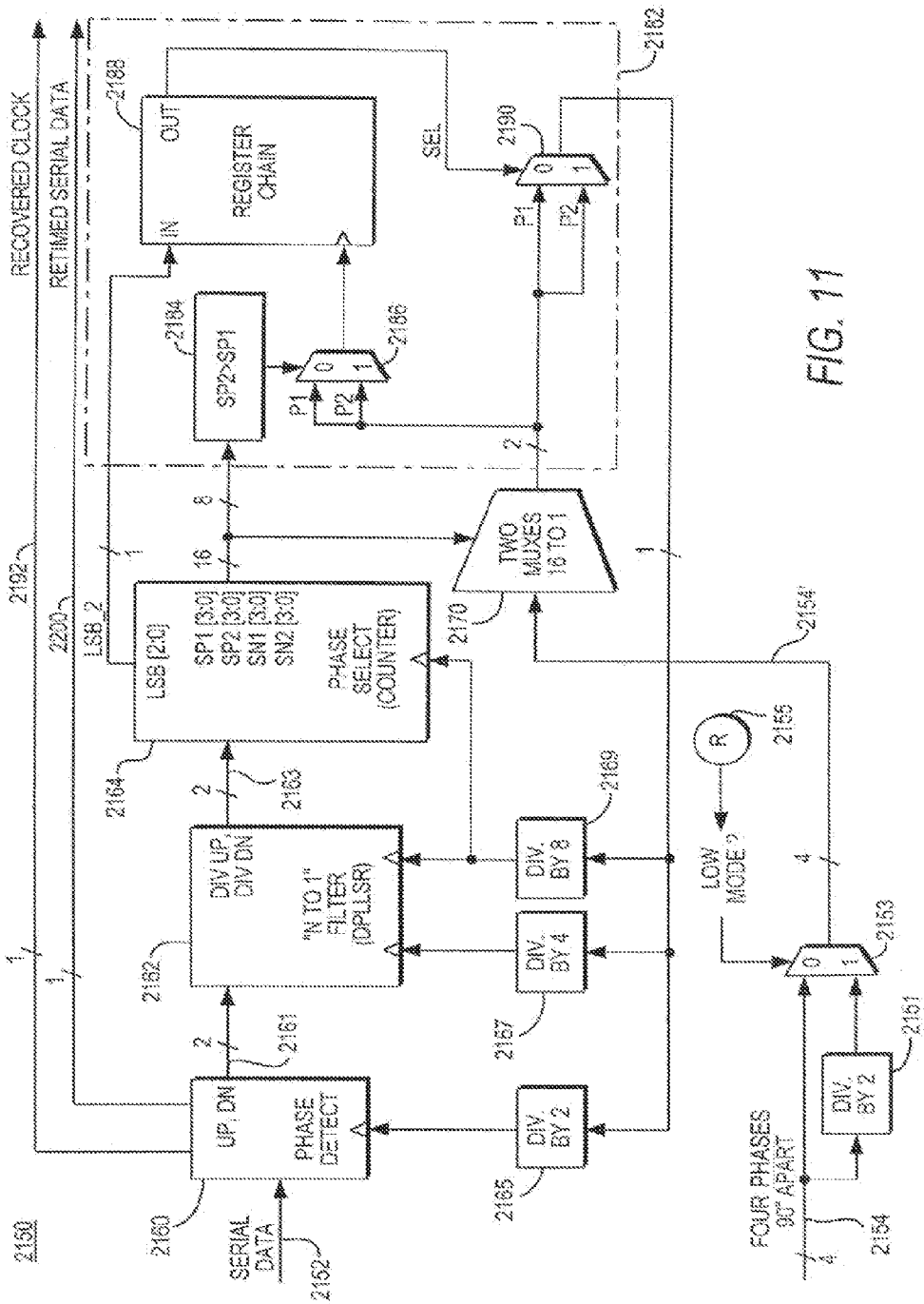
FIG. 11 is similar to FIG. 6, but shows another illustrative embodiment of FIG. 6 type circuitry in accordance with the invention.

FIG. 11 shows an alternative embodiment that also allows the serial data rate to be a fraction of the A-CDR clock frequency if desired, and that also decreases the angle of jitter as compared to the FIG. 6 embodiment. FIG. 12 shows the various operating modes and ranges of the FIG. 11 circuitry. As in the case of FIG. 6, the FIG. 11 circuitry has two possible modes: normal and low. In normal mode the serial data rate is one-quarter the A-CDR clock frequency. Thus with an A-CDR clock frequency as low as 0.8 GHz, the serial data rate can be as low as 0.2 Gbps. In low mode the serial data rate is one-eighth the A-CDR clock frequency. Accordingly, in low mode the serial data rate can be as low as 0.1 Gbps with an A-CDR clock frequency as low as 0.8 GHz.

The circuitry shown in FIG. 11 has many similarities to the FIG. 6 circuitry. Accordingly, the reference numbers used for various elements in FIG. 11 that are similar to elements in FIG. 6 have reference numbers in FIG. 11 that are increased by 1000 relative to the reference numbers of the corresponding elements in FIG. 6. Thus, for example, N to 1 filter 2162 in FIG. 11 corresponds to N to 1 filter 1162 in FIG. 6. This basic similarity between almost all elements in FIGS. 6 and 11 will make it unnecessary to again describe many aspects of many elements in FIG. 11.

Like the FIG. 6 circuitry, the FIG. 11 circuitry receives four candidate clock signals 2154—spaced 90° apart—from A-CDR circuitry such as circuitry 510 in FIG. 4. Multiplexer circuitry 2153 passes those signals to leads 2154', either unaltered (normal mode) or after frequency division by 2 in divide by 2 circuitry 2151 (low mode). Multiplexer circuitry 2153 may be controlled to make this selection by programmable memory (RAM) cell 2155.

Figure 13:
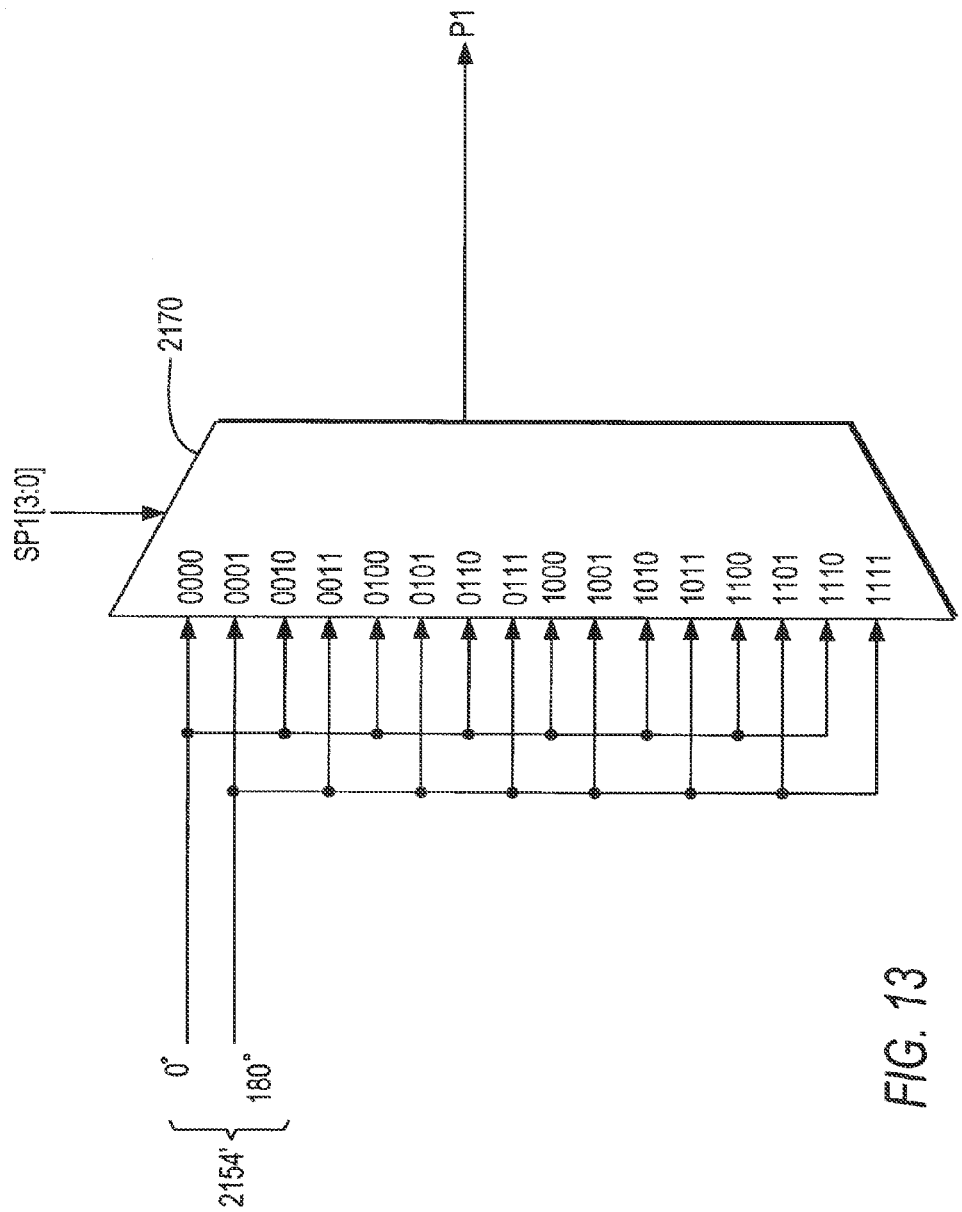
FIG. 13 is a simplified schematic block diagram of an illustrative embodiment of a representative one of several elements that are used in FIG. 11 in accordance with the invention.

Only two of the output signals of multiplexer circuitry 2153 are actually used, and the two signals that are used are spaced apart in phase by 180°. FIG. 13 shows application of these two signals to a representative one of two 16 to 1 multiplexers 2170. The multiplexer shown in FIG. 13 is the one that uses the SP1[3:0] signals output by phase select circuitry 2164 (FIG. 11) to select the further candidate clock signal P1. FIG. 13 shows that the 0° phase candidate clock signal 2154' is applied to the "even" numbered inputs to the depicted multiplexer 2170, while the 180° phase candidate clock signal 2154' is applied to the "odd" numbered inputs to that multiplexer. Thus depicted multiplexer 2170 outputs the 0° phase signal 2154' when the SP1[3:0] signals represent the binary equivalent of decimal 0, 2, 4, 6, 8, 10, 12, or 14, and it outputs the 180° phase signal 2154' when the SP1[3:0] signals represent the binary equivalent of decimal 1, 3, 5, 7, 9, 11, 13, or 15. The other one of multiplexers 2170 in FIG. 11 is similar to what is shown in FIG. 13, except that it uses the SP2[3:0] signals to select the P2 signal from the same inputs as are shown for the multiplexer in FIG. 13.

Because the output signal of multiplexer 2190 in FIG. 11 is one or the other of above-described signals P1 or P2, that signal has frequency that is four times the serial data rate of signal 2152. This is true without regard for whether the circuitry is operating in normal or low mode. (As noted above, in low mode the A-CDR output signals on leads 2154 have frequency eight times the serial data rate, but that ratio is reduced to four by frequency divider 2151.) Accordingly, with the addition of frequency divider 2165 in FIG. 11, phase detect circuitry 2160 can be constructed and operated as shown (in FIGS. 9 and 10) and described above for phase detect circuitry 1160. Divide by 2 circuitry 2165 needs to be added to the circuitry of FIG. 11 (as compared to the circuitry of FIG. 6) because the ratio between the frequency of the output signal of multiplexer 2190 and the serial data rate is four (as compared to a corresponding ratio of two in the FIG. 6 embodiment).

In the same way that frequency division needs to be increased by a factor of two in going from FIG. 6 to FIG. 11 at the point (2165) described in the preceding paragraph, other frequency divisions (1167 and 1169) in FIG. 6 need to be increased by a factor of two for the FIG. 11 embodiment. Thus divide by 2 circuitry 1167 in FIG. 6 becomes divide by 4 circuitry 2167 in FIG. 11, and divide by 4 circuitry in FIG. 6 becomes divide by 8 circuitry 2169 in FIG. 11.

Another difference between the FIG. 6 and FIG. 11 embodiments is that in FIG. 11 the outputs of phase select circuitry 2164 like SP1[3:0] are each four bits in length, whereas in FIG. 6 they are only three bits in length. Four bits are needed in FIG. 11 because in this embodiment multiplexers 2170 are 16 to 1. In FIG. 6 corresponding multiplexers 1170 are only 8 to 1. This difference is also what reduces the amount of recovered clock jitter in the FIG. 11 embodiment relative to the amount associated with the FIG. 6 embodiment. In FIG. 6 there are eight candidate clock signals 1154' for the circuitry to choose from. The magnitude of recovered clock jitter is therefore 360°÷8=45°. In FIG. 11, however, there are 16 candidate clock signals 2154' for the circuitry to choose from. The magnitude of recovered clock jitter is therefore 360°÷16=22.5°.

Except for the differences mentioned above, the circuitry of FIG. 11 can be like the FIG. 6 circuitry in construction and operation. Further detailed discussion specific to FIG. 11 is therefore unnecessary.

Figure 14:
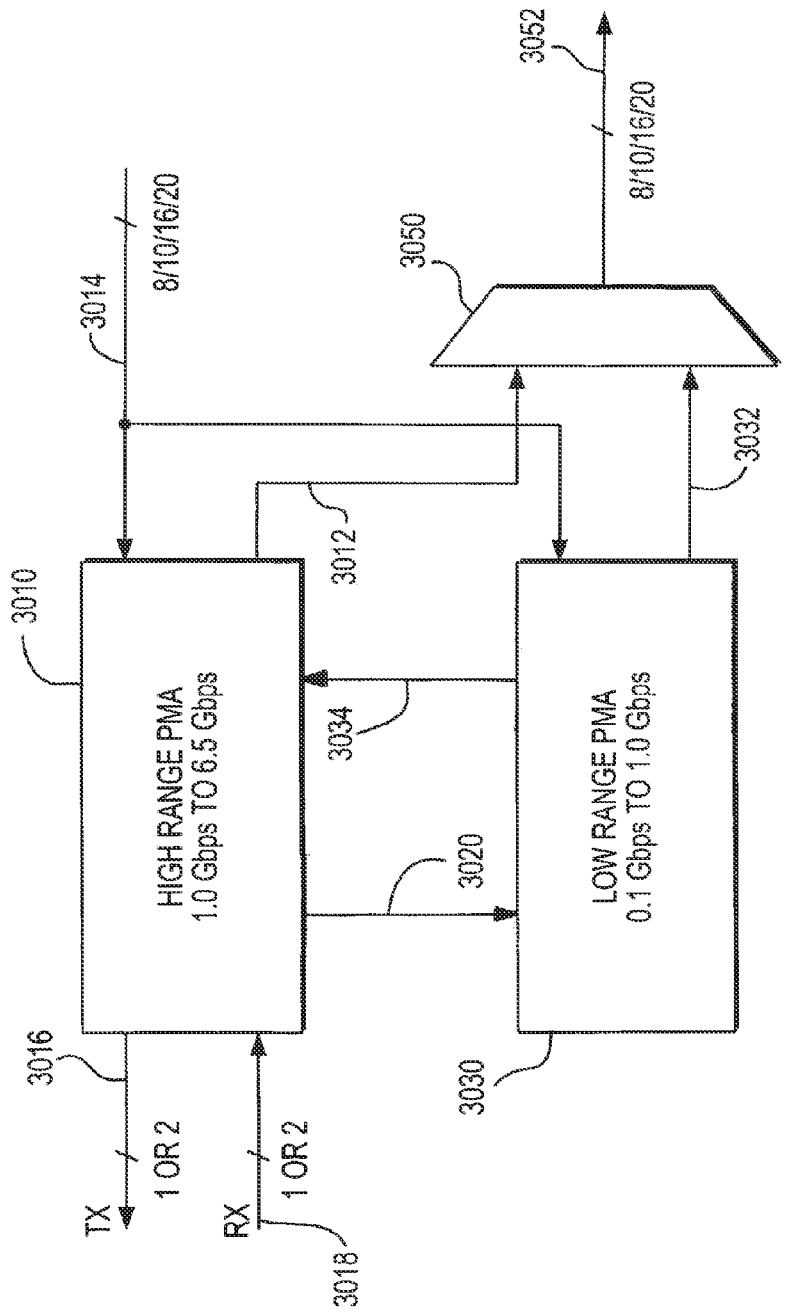
FIG. 14 is a simplified schematic block diagram of circuitry that may combine aspects of what is shown in FIG. 1 with aspects of what is shown in FIG. 6 or FIG. 11 in accordance with the invention.

FIG. 14 shows how circuitry of the type shown in FIG. 1 can be combined with circuitry of the type shown in FIG. 6 or FIG. 11 to provide circuitry that can support a wider range of data rates (particularly at the low end) without having to provide lower-speed PLL clock signals. FIG. 14 also shows transmit as well as receive aspects of such circuitry. The circuitry shown in FIG. 14 includes high range physical medium attachment ("PMA") circuitry 3010, low range PMA circuitry 3030, and multiplexer circuitry 3050. High range PMA circuitry 3010 can include circuitry like that shown in FIG. 1 with the addition of (1) deserializer circuitry for converting the retimed serial data output of the FIG. 1 circuitry to parallel form on leads 3012, and (2) serializer circuitry for converting data to be transmitted from parallel form on leads 3014 to serial form on lead(s) 3016. (Examples of this, including examples of serializer and deserializer circuitry, are shown in Lee et al. U.S. Pat. No. 7,366,267 and some of the other references mentioned above.) FIG. 14 shows the circuitry able to support serial data in either single-ended (e.g., true-only) or double-ended (e.g., true and complement) form on leads such as 3016 and 3018; and it shows the circuitry able to support parallel data in any of widths 8 bits, 10 bits, 16 bits, or 20 bits on leads such as 3014 and 3052. FIG. 14 shows high range PMA 3010 being used for data rates in the range from 1.0 Gbps to 6.5 Gbps; and it shows low range PMA 3030 being used for data rates in the range from 0.1 Gbps to 1.0 Gbps.

Low range PMA circuitry 3030 can include circuitry of the type shown in FIG. 6 or FIG. 11. In addition, low range PMA circuitry 3030 can include (1) deserializer circuitry for converting the retimed serial data output signal of the FIG. 6 or FIG. 11 circuitry to parallel form on leads 3032, and (2) serializer circuitry for converting data to be transmitted from parallel form on leads 3014 to serial form on lead 3034. Low range PMA circuitry 3030 receives candidate clock signals (e.g., as on leads 1154 in FIG. 6 or 2154 in FIG. 11) and the received serial data (ultimately from lead(s) 3018) via leads 3020. The serial data output by low range PMA circuitry 3030 is ultimately output via lead(s) 3016. Multiplexer circuitry 3050 selects either the parallel data output signals 3012 of high range PMA 3010 or the similar signals 3032 of low range PMA 3030 as the ultimate parallel data outputs 3052 of the circuitry. Low range PMA circuitry 3030 is only used when the data rate is lower than can be handled by high range PMA 3010.

Whereas the transmitter portion of high range PMA circuitry 3010 can be quite straight-forward (e.g., primarily a serializer), the transmitter portion of low range PMA circuitry 3030 may be somewhat more complicated to facilitate the transmission of data at relatively low data rates without the need for correspondingly low-frequency PLL clocks. An illustrative embodiment of such low data rate transmitter circuitry is shown in FIG. 15.

Figure 15:
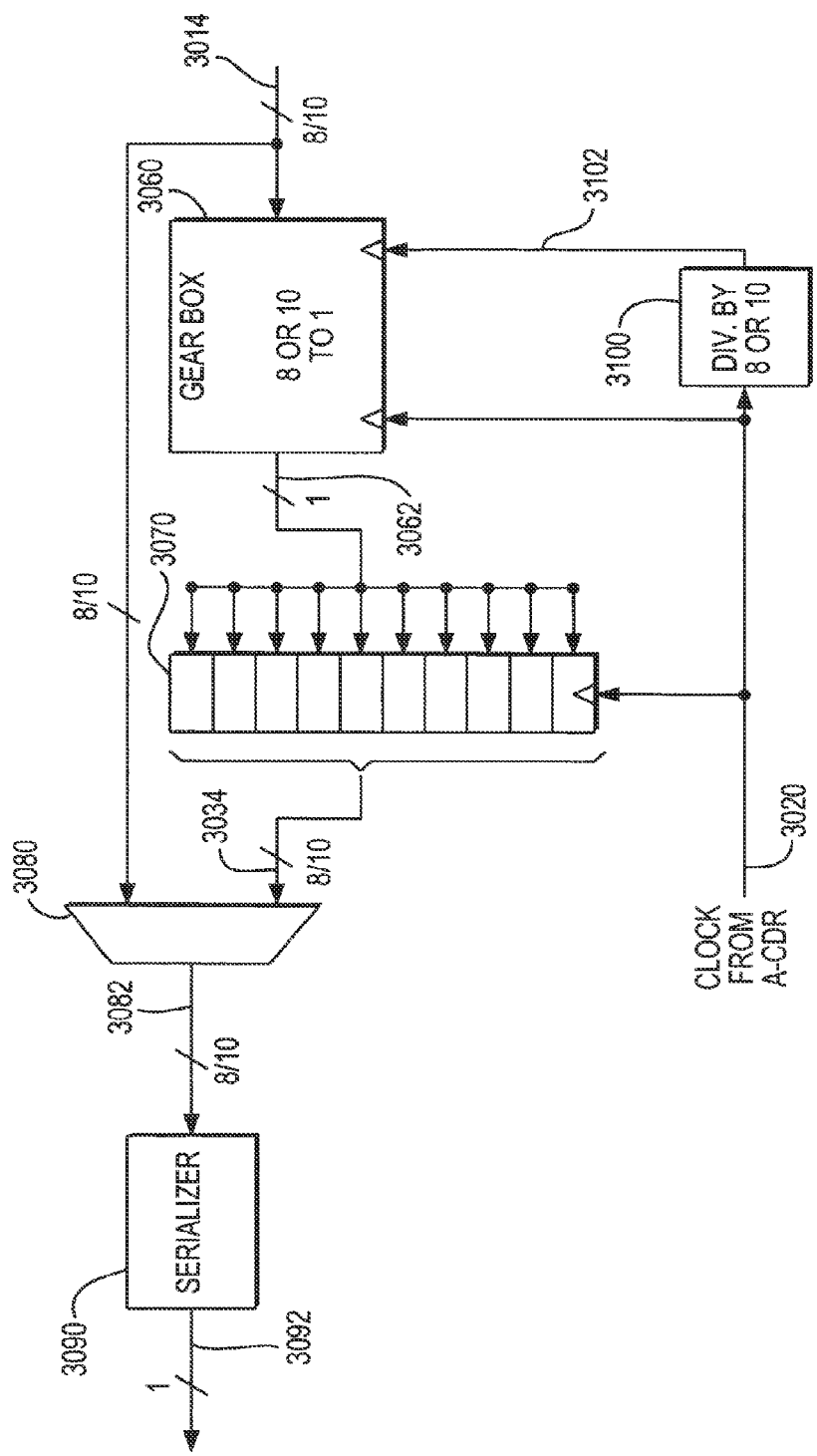
FIG. 15 is a simplified schematic block diagram of additional circuitry that may be employed in accordance with the invention; for example, in circuitry of the type shown in FIG. 14.

The FIG. 15 circuitry includes "gear box" circuitry 3060, register circuitry 3070, multiplexer circuitry 3080, serializer circuitry 3090, and frequency divider circuitry 3100. Elements 3060, 3070, and 3100 can be in low range PMA circuitry 3030. Elements 3080 and 3090 can be in high range PMA circuitry 3010. The clock signal applied to divider circuitry 3100 can be a PLL clock signal from circuitry 3010 and hence is shown on a lead 3020. It will be understood, however, that this clock signal may already have been divided in frequency by a factor such as 10. The parallel output signals of register circuitry 3070 are shown on multiple leads 3034. This is somewhat different from the above discussion of FIG. 14, which suggests that circuitry 3030 deserializes transmit data down to a single lead 3034. However, those skilled in the art will understand that what is now described is an alternative to that earlier discussion. FIG. 15 also differs from FIG. 14 by showing parallel data widths of only 8 bits or 10 bits. Further serializing (so-called byte serialization) may be performed upstream from what is shown in FIG. 15 to increase the number of parallel data widths supported (e.g., to include 16 bits and 20 bits).

The purpose of gear box circuitry 3060 and register circuitry 3070 is to controllably replicate each bit in the parallel data from leads 3014 onto a plurality of further parallel leads 3034. For example, if ten bits of data are applied in parallel via leads 3014, gear box 3060 outputs each of those bits one after another on lead 3062 at a bit rate that is 10 times the parallel data byte rate. In this example, if the parallel data byte rate is 10 MHz, then the serial data bit rate is 100 MHz. Divider circuitry 3100 divides the clock signal on lead 3020 (which is at the serial data bit rate needed for the data on lead 3062) to the parallel data byte rate on lead 3102. Gear box circuitry 3060 receives both bit rate clock signal 3020 and byte rate clock signal 3102 so that it can perform the above-described parallel to serial data conversion.

Register circuitry 3070 registers each bit output by gear box 3060 in a plurality of registers. In the illustrative embodiment shown in FIG. 15, register circuitry 3070 includes ten registers that register each bit from gear box 3060 in parallel. Register circuitry 3070 is therefore also clocked by the bit rate clock on lead 3020. The contents of the registers in circuitry 3070 are applied in parallel to parallel leads 3034.

Assuming that circuitry 3060/3070 is in use, multiplexer circuitry 3080 applies the signals on as many of leads 3034 as are desired to a corresponding number of leads 3082. For example, all ten register 3070 outputs 3034 may be applied to ten leads 3082, or only eight outputs 3034 may be applied to eight leads 3082. If circuitry 3060/3070 is not in use, multiplexer 3080 applies the signals on leads 3014 to a corresponding number of leads 3082.

Serializer circuitry 3090 converts the data it receives in parallel via leads 3082 to serial form on lead 3092. For example, if multiplexer 3090 receives 10 bits of parallel data at a byte rate of 100 MHz, it outputs that data at a serial bit rate of 1000 MHz=1 GHz. If the parallel data on leads 3082 has come from leads 3034, all of the bits serializer 3090 receives at any one time will be the same. The serial output 3092 of this data will look like one bit of relatively long duration. Thus the relatively low-speed data passed through elements 3060, 3070, 3080, and 3090 is effectively "oversampled" in order to output it on lead 3092 using a PLL clock having a higher frequency than the bit rate of the data being output. On the other hand, if elements 3060 and 3070 are not being used (because the transmit data rate is more compatible with the PLL clock frequency), the various bits received by serializer 3090 at any given time can have different values, and they will each be sampled and output once in serial form on lead 3092.

Some examples of use of circuitry of the type shown in FIG. 15 (especially routing through elements 3060 and 3070) will now be provided.

Example 1

Data rate: 100 Mbps.
Over-transmission rate: 10 times.
TX PLL serial clock: 1 GHz (assumed to be the minimum).
Parallel data width (leads 3014): 10 bits.
Parallel byte rate: 10 MHz.
Serial bit rate (lead 3062): 100 MHz.
Number of leads 3034 used: 10.
Clock frequency on lead 3020: 100 MHz.
Clock frequency on lead 3102: 10 MHz.
Clock frequency on parallel side of serializer 3090: 100 MHz.
Clock frequency on serial side of serializer 3090: 1 GHz.

Assuming that the permissible range for the TX PLL clock is 1 GHz to 6.5 GHz (or 0.5 GHz to 3.25 GHz for double data rate ("DDR") or dual edge clocking), the general configuration of the circuitry employed in this example can be utilized until the serial clock reaches 6.5 GHz (or 3.25 GHz DDR). At that point the data rate is 650 Mbps and the clock frequency on lead 3102 is 65 MHz. After this upper limit is reached, a different mode has to be entered where each data bit is over-transmitted eight times. The following Example 2 is an example of this mode.

Example 2

Data rate: 800 Mbps.
Over-transmission rate: 8 times.
Clock frequency on lead 3102: 80 MHz.
Parallel data width (leads 3014): 10 bits.
Serial bit rate (lead 3062): 640 bits.
Number of leads 3034 used: 8.
Clock frequency on parallel side of serializer 3090: 640 MHz.
Clock frequency on serial side of serializer 3090: 2.56 GHz (or 1.28 GHz DDR).

Again assuming that the upper limit for the TX PLL clock is 6.5 GHz (3.25 GHz DDR), the upper limit for operation in the mode illustrated by Example 2 is reached when the data rate is 6.5/8/8=1.015625 Gbps (approximately 1 Gbps).

Two ratios are provided in gear box circuitry 3060 (10 to 1 and 8 to 1) to accommodate the standard data bus widths of 8 and 10.

It will be understood that the foregoing is only illustrative of the principles of the invention, and that various modifications can be made by those skilled in the art without departing from the scope and spirit of the invention. For example, the number of registers 188a-d1 in register chain 188 can be varied (e.g., increased from four) if desired. As another example of possible modifications, the use of eight candidate recovered clock signals 154 is only illustrative, and any other suitable, larger or smaller, plural number of such signals can be used instead if desired. Other examples of modifications within the scope of the invention include (1) analog PLL (A-CDR) clocks with different frequency ranges, (2) the use of data buses having different widths, and (3) the use of different frequency division factors or ratios. Any of the circuitry shown in FIGS. 6-15 can be used in the circuitry or systems shown in FIGS. 4 and 5.

The invention claimed is:

1. Apparatus for converting parallel data to serial data, the apparatus comprising:
    serializer circuitry for:
        receiving, at a first clock rate, the parallel data; and
        outputting, at a second clock rate, each bit of the parallel data, one bit after another in succession; and
    circuitry for replicating each bit that is output by the serializer onto a number of parallel leads, wherein the number is based on a ratio of the first clock rate and the second clock rate.

2. The apparatus of claim 1, wherein the serializer circuitry is first serializer circuitry, the apparatus further comprising second serializer circuitry for:

receiving, in parallel, signals from the number of parallel leads; and outputting each of the signals, one signal after another, on a serial output lead.

3. The apparatus of claim 1, wherein the second clock rate is larger than the first clock rate.

4. The apparatus of claim 1, wherein the circuitry is clocked by a clock having the second clock rate.

5. The apparatus of claim 1, wherein width of the parallel data is selectable.

6. The apparatus of claim 1, wherein the number of parallel leads is selectable.

7. The apparatus of claim 1, further comprising routing circuitry operable to selectively substitute the parallel data for outputs of the serializer circuitry on the number of parallel leads.

8. The apparatus of claim 1, further comprising divider circuitry operable to divide a clock signal having the second clock rate to obtain the first clock rate.

9. A method for converting parallel data to serial data, the method comprising:

receiving, at a first clock rate, the parallel data;

generating, at a second clock rate, a first set of serial data comprising each bit of the parallel data arranged one bit after another in succession; and replicating each bit of the first set of serial data onto a number of parallel leads, wherein the number is based on a ratio of the first clock rate and the second clock rate.

10. The method of claim 9, wherein the second clock rate is larger than the first clock rate.

11. The method of claim 9, wherein width of the parallel data is selectable.

12. The method of claim 9, wherein the parallel data is first parallel data, the method further comprising:

selectively substituting, in second parallel data, the first parallel data for the number of instances, arranged in parallel, of each successive bit of the first set of serial data, wherein the second parallel data comprises the number of instances, arranged in parallel, of each successive bit of the first set of serial data.

13. The method of claim 9, further comprising dividing a clock signal having the second clock rate to obtain the first clock rate.

14. Apparatus for converting parallel data to serial data, the apparatus comprising:

serializer circuitry for:

receiving, at a first clock rate, a first set of parallel data; and generating, at a second clock rate, a first set of serial data comprising each bit of the first set of parallel data arranged one bit after another in succession; and circuitry for generating a second set of parallel data comprising a number of instances, arranged in parallel, of each successive bit of the first set of serial data, wherein the number is based on a ratio of the first clock rate and the second clock rate.

15. The apparatus of claim 14, wherein the serializer circuitry is first serializer circuitry, the apparatus further comprising second serializer circuitry for generating a second set of serial data, the second set of serial data comprising each bit of the second set of parallel data arranged one bit after another in succession.

16. The apparatus of claim 15, wherein the second clock rate is larger than the first clock rate.

17. The apparatus of claim 14, wherein the circuitry is clocked by a clock having the second clock rate.

18. The apparatus of claim 14, wherein width of the first set of parallel data is selectable.

19. The apparatus of claim 14, wherein width of the second set of parallel data is selectable.

20. The apparatus of claim 14, further comprising divider circuitry operable to divide a clock signal having the second clock rate to obtain the first clock rate.

* * * * *